(12) United States Patent
Kamiya

(10) Patent No.: US 6,281,738 B1
(45) Date of Patent: Aug. 28, 2001

(54) BUS DRIVER, OUTPUT ADJUSTING METHOD AND DRIVER

(75) Inventor: Hiroshi Kamiya, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/387,510

(22) Filed: Sep. 1, 1999

(30) Foreign Application Priority Data

Sep. 4, 1998 (JP) .................................. 10-250266

(51) Int. Cl.$^7$ .......................... H01L 35/00; H01L 37/00; H03K 3/42; H03K 17/78
(52) U.S. Cl. ............................ 327/513; 327/77; 327/143; 327/170; 326/32
(58) Field of Search ........................... 327/108–112, 513, 327/403, 72, 77, 78, 83, 512, 80, 143, 158, 170; 326/26, 62, 86, 90, 32

(56) References Cited

U.S. PATENT DOCUMENTS

| | | | |
|---|---|---|---|
| 4,565,935 | * | 1/1986 | Rolfe ..................................... 327/513 |
| 4,945,311 | * | 7/1990 | Smith .................................... 327/513 |
| 5,159,520 | * | 10/1992 | Toyooka et al. ..................... 327/512 |
| 5,563,578 | * | 10/1996 | Isenstein .............................. 340/521 |
| 5,742,832 | * | 4/1998 | Buxton et al. ......................... 326/26 |
| 5,889,419 | * | 3/1999 | Fischer et al. ....................... 327/403 |
| 5,959,496 | * | 9/1999 | Parker ................................... 327/560 |
| 6,087,866 | * | 7/2000 | Prucklmayer ........................ 327/143 |
| 6,163,183 | * | 12/2000 | Azimi et al. .......................... 327/143 |

FOREIGN PATENT DOCUMENTS

| | | |
|---|---|---|
| 1-171317 | 7/1989 | (JP) . |
| 2-7615 | 1/1990 | (JP) . |
| 4-167615 | 6/1992 | (JP) . |
| 5-175807 | 7/1993 | (JP) . |
| 9-200029 | 7/1997 | (JP) . |

\* cited by examiner

*Primary Examiner*—Terry D. Cunningham
*Assistant Examiner*—Long Nguyen
(74) *Attorney, Agent, or Firm*—Foley & Lardner

(57) ABSTRACT

A bus driver circuit includes a diode, a resistor, a constant voltage source, a constant voltage comparing circuit, the first output buffer circuit, the second output buffer circuit. An anode of the diode is connected to a power source, whereas a cathode thereof is connected to an end of the resistor. The other end of the resistor is connected to the ground. The constant voltage source applies, to the voltage comparing circuit, a reference voltage, which is substantially identical with a voltage of the cathode included in the diode when a temperature of the first output buffer circuit becomes a temperature Tcr at which a ringing event occurs in an output signal from the bus driver circuit. The voltage comparing circuit compares the reference voltage and the voltage of the cathode. The voltage comparing circuit outputs a control signal to the first output buffer circuit in accordance with the compared result. Both of the first and second output buffer circuits are connected to a signal output terminal to be connected to a bus and a signal input terminal connected to a signal processor. The first output buffer circuit is a three state buffer circuit. While the bus driver circuit is being operated, the voltage comparing circuit compares the voltage of the cathode and the reference voltage. When the voltage of the cathode is equal to or above the reference voltage, that is, when the temperature of the first output buffer circuit becomes equal to or above the temperature Tcr, the voltage comparing circuit outputs, to the first output buffer circuit, a control signal for inactivating the first output buffer circuit. The first output buffer circuit is inactivated when the control signal is input thereto.

9 Claims, 10 Drawing Sheets

BUS DRIVER, OUTPUT ADJUSTING METHOD AND DRIVER

BACKGROUND OF THE INVENTION

1. Field of the Invention

The present invention relates to a bus driver and a driver each of which has a temperature detecting system. The present invention also relates to an output adjusting method for controlling operations of a circuit in accordance with a temperature of the circuit.

2. Description of the Related Art

A plurality of units (Central Processing Unit, Memory Unit or the like) included in a single system are connected with each other via a bus comprising a plurality of transmission paths. Signals (data and the like) are transmitted between the plurality of units via the bus.

Each of the units connected to the bus includes an output buffer for driving the bus (i.e. for outputting signals to the bus) and an input buffer for receiving signals transmitted on the bus.

Since the signal is transmitted via the output buffer, a voltage level of an output signal becomes stable, and the output signal can be stabilizingly output to the bus.

To maximize driving performance of the bus, as shown in FIG. 6, an output buffer may be used, wherein an "n" ("n" is an integer equal to or greater than "2") number of buffer circuits 501 are connected in parallel. This type of output buffer can accurately drive the bus at high speed compared to the case where a single buffer circuit is used, because the driving performance (performance for current-supply) of the bus can be enhanced by "n" times.

However, as a temperature of the output buffer including the plurality of parallelly-connected buffer circuits 501 rises, signals are output from the buffer circuits 501 respectively at different phases. Therefore, a ringing event occurs in a signal which is generated as a combination of the signals from the buffer circuits 501.

If the ringing event occurs in the signal generated as the combination of the output signals from the output buffer, a problem may arise that the unit receiving the generated signal is operated inappropriately.

A similar problem commonly appears not only in the output buffer circuit, but in an electric circuit comprising a plurality of parallelly-operating circuits.

SUMMARY OF THE INVENTION

Accordingly, an object of the present invention is to provide a bus driver and a driver both of which can stabilizingly outputs a signal without being influenced by a temperature of the drivers.

Another object of the present invention is to provide an output adjusting method for controlling ringing, which occurs in a signal, without being influenced by a temperature of a circuit.

According to the first aspect of the present invention, there is provided a bus driver comprising:

a plurality of output buffer circuits which are connected to a common input terminal and a common output terminal and each of which outputs a signal, for driving a bus, having a signal level corresponding to a signal level of a signal supplied to the input terminal, to the output terminal;

a temperature detecting circuit which detects a temperature of at least one of the output buffer circuits; and a controlling circuit which determines whether the detected temperature of at least one of the plurality of output buffer circuits is equal to or above a first reference temperature, and which inactivates at least one of the plurality of output buffer circuits when determined that the detected temperature is equal to or above the first reference temperature.

According to the present invention, when the temperature of the output buffer circuits is equal to or above the first reference temperature, at least one of the output buffer circuits is inactivated. Thus, the bus drivers can be controlled to be appropriately operated, by setting the first reference temperature at a temperature at which the circuits are not operated appropriately.

The plurality of output buffer circuits may include three or more circuits.

The controlling circuit may compare the temperature detected by the temperature detecting circuit with the first reference temperature and also with a second reference temperature which is above the first reference temperature, inactivates a first predetermined number of output buffer circuits when the temperature detected by the temperature detecting circuit is equal to or above the first reference temperature but below the second reference temperature, and inactivates a second predetermined number of output buffer circuits in addition to the first predetermined number of output buffer circuits when the detected temperature is equal to or above the second reference temperature.

The temperature detecting circuit may include a diode and a resistor which are connected in series between a power source and a ground.

The controlling circuit may compare a voltage of a connecting point, where the diode circuit and the resistor are connected, with a first reference voltage substantially equal to a voltage of the connecting point when said plurality of output buffer circuits are at the first reference temperature, and also with a second reference voltage substantially equal to the voltage of the connecting point when the plurality of output buffer circuits are at the second reference temperature, and output a signal for activating or inactivating the plurality of output buffer circuits in accordance with a compared result to the plurality of output buffer circuits.

At least one of the plurality of output buffer circuits which is inactivated by the controlling circuit comprises a three state buffer circuit.

The controlling circuit prevents ringing from occurring in a signal output from the plurality of output buffer circuits, by inactivating at least one of the plurality of output buffer circuits.

According to the second aspect of the present invention, there is provided an output adjusting method comprising:

detecting a temperature of at least one of plurality of output buffer circuit connected to a common input terminal and an output terminal;

comparing the detected temperature of said plurality of output buffer circuits and a first reference temperature;

inactivating at least one of the plurality of output buffer circuits when determined the temperature of the at least one of the plurality of output buffer circuits is equal to or above the first reference temperature;

controlling the entire output buffer circuits to output signals substantially at an identical phase parallelly to the output terminal when the detected temperature is below the first reference temperature; and controlling at least one of the plurality of activated output buffer circuits to output a signal in which any ringing event does not substantially occur, to the output terminal, when the detected temperature is equal to or above the first reference temperature.

According to this invention, the number of buffer circuits outputting a signal can be controlled, because the buffer circuits are activated and inactivated in accordance with their temperature. Hence, a signal substantially having no ringing can be output from the output terminal.

The signals from the buffer circuits are controlled to be appropriately output, by setting the reference temperature at a temperature at which the ringing occurs in the signals output from the buffer circuits.

The output buffer circuits may include three or more circuits.

The inactivating may include inactivating a first number of output buffer circuits when determined that the detected temperature is equal to or above the first reference temperature, and inactivating a second number of output buffer circuits when determined that the detected temperature is equal to or above a second reference temperature above the first reference temperature.

The second number may be larger than the first number.

According to the third aspect of the present invention, there is provided a driver comprising:

an "n" number of driver circuits which are connected to a common input terminal and a common output terminal, respectively output signals at an identical phase, and drive a target device to be driven in cooperation with each other;

a temperature detecting circuit which detects a temperature of at least one of the "n" number of driver circuits; and a controlling circuit which determines whether the temperature detected by the temperature detecting circuit is equal to or above a predetermined reference temperature, and sets all of the "n" number of driver circuits in an active state when determined that the detected temperature is below the reference temperature so as to control the "n" number of driver circuits to drive the target device, and inactivates an "m" ("m" is a natural number smaller than "n") number of driver circuits included in the "n" number of driver circuits when determined that the temperature detected by the temperature detecting circuit is above the reference temperature, and controls an "n−m" number of driver circuits to drive the target device, in a state where a ringing event, resulted from signals which are output by the driver circuits at different phases in accordance with the temperature of the driver circuits, is controlled.

BRIEF DESCRIPTION OF THE DRAWINGS

These objects and other objects and advantages of the present invention will become more apparent upon reading of the following detailed description and the accompanying drawings in which.

DETAILED DESCRIPTION OF THE PREFERRED EMBODIMENT

An output adjusting circuit according to an embodiment of the present invention will now be explained with reference to the accompanying drawings.

Figure 1:
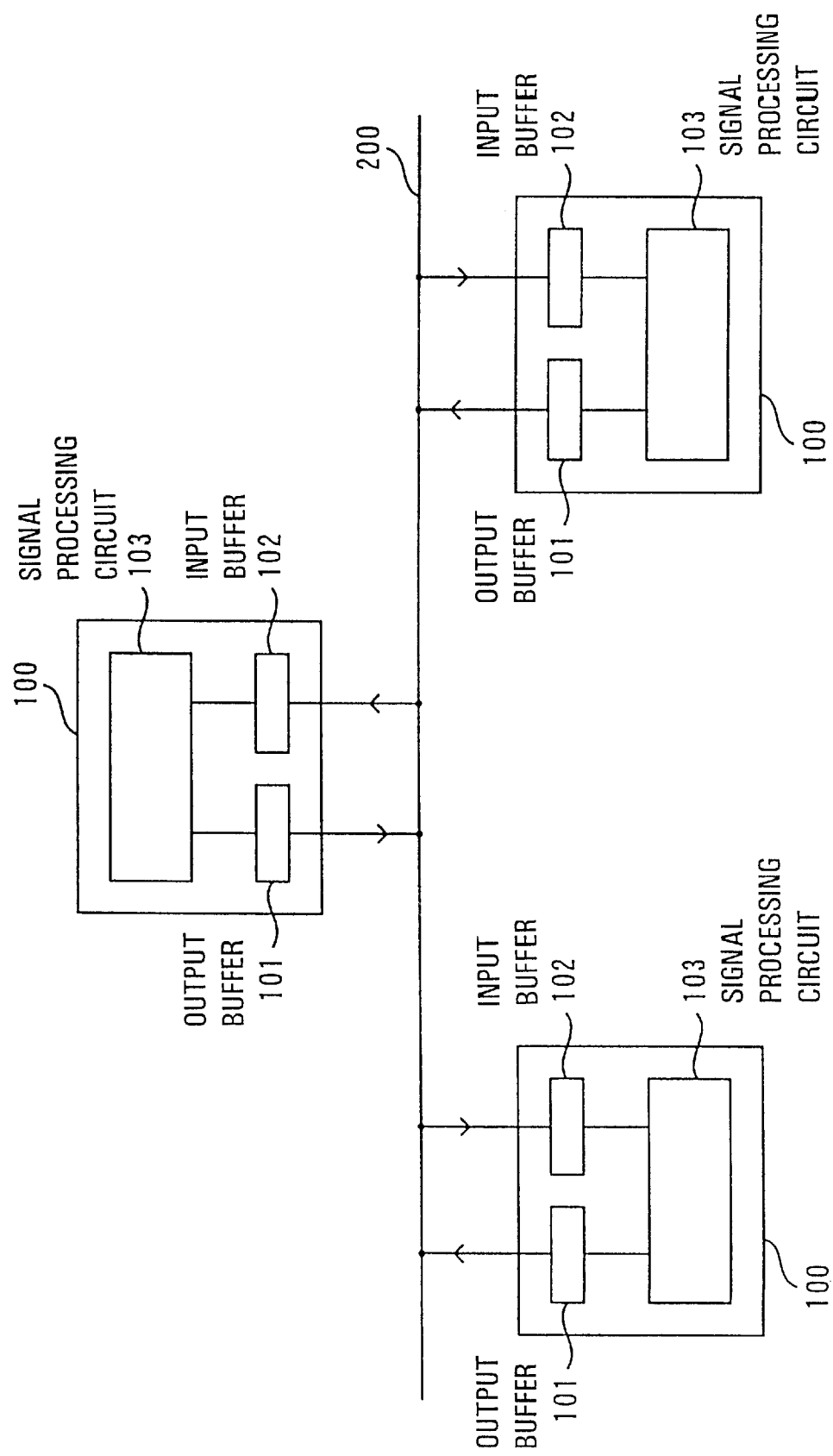
FIG. 1 is a diagram showing a structure of a system according to an embodiment of the present invention.

FIG. 1 is a diagram exemplifying a system of this embodiment. The structure of the system is that a plurality of apparatuses 100 (bus utilization apparatuses) are connected with each other via a bus.

Each of the bus utilization apparatuses 100 may be a CPU, a memory, a type of interface, a Direct Memory Access (DMA) or a secondary memory unit.

Each of the bus utilization apparatuses 100 includes an output buffer 101 for outputting signals to the bus 200 (a target device to be driven by the output buffer 101), an input buffer 102 for receiving signals which are transmitted on the bus 200, and a signal processing circuit 103 for processing the signals received via the input buffer 102 or the signal to be output to the bus via the output buffer 101.

The output buffer includes a particular number of bus driver circuits which corresponds to a width of the bus (a number of bits of a signal transmitted via the 5 bus).

Figure 2:
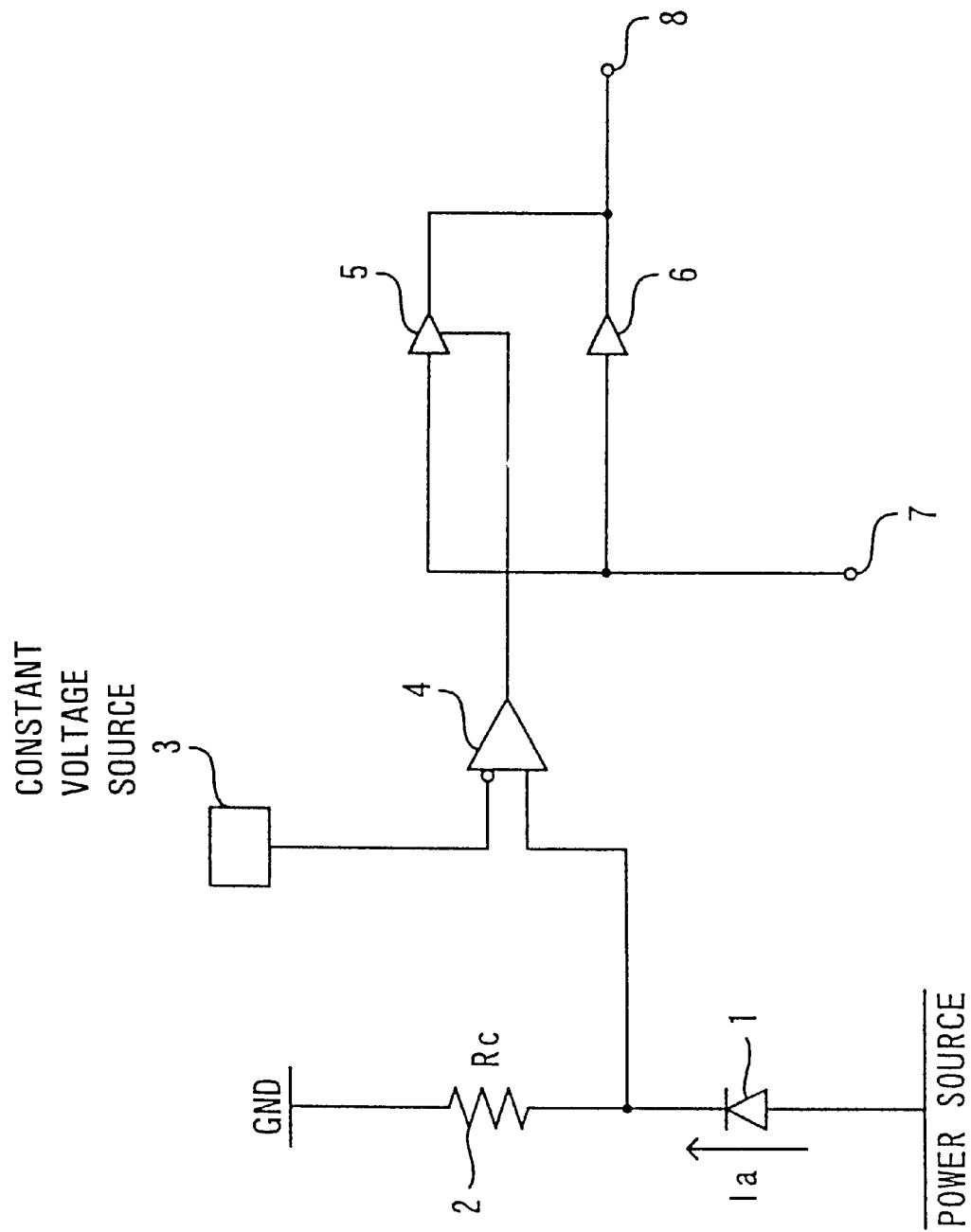
FIG. 2 is a diagram showing a structure of a bus driver circuit employing an output adjusting circuit according to the embodiment of the present invention.

FIG. 2 is a diagram showing a structure of the bus driver circuit employing the output adjusting circuit of this embodiment. FIG. 2 shows the structure of the bus driver circuit for handling 1 bit data. For example, if the bus is 32 bits wide (i.e., a number of transmission paths for forming the bus is 32), the output buffer includes 32 identical circuits.

As shown in FIG. 2, the bus driver circuit comprises a diode 1, a resistor 2, a constant voltage source 3, a voltage comparing circuit 4, the first output buffer circuit 5, the second output buffer circuit 6, a signal input terminal 7 and a signal output terminal 8. The output adjusting circuit employed in the bus driver circuit corresponds to a group of the diode 1, the resistor 2, the constant voltage source 3 and the voltage comparing circuit 4, wherein the first output buffer circuit 5 may be included.

An anode of the diode 1 is connected to a power source, whereas a cathode is connected to one end of the resistor 2.

The one end of the resistor 2 is connected to the cathode, as described above, and the other end is grounded.

As described above, when the diode 1 and the resistor 2 are connected in series between the power source and the ground, it becomes possible to detect a temperature of the bus driver circuit. Specifically, the voltage of the cathode of the diode 1 corresponds to the temperature of the bus driver circuit.

The constant voltage source 3 applies a reference voltage (Vref) to the voltage comparing circuit 4. The reference voltage is set as follows. First, a temperature Tcr, at which an oscillating signal is generated as a combination of output signals respectively sent from the first and second output buffer circuits 5 and 6, is obtained. Next, a value of a current Ia flowing into the diode 1 is obtained at the obtained temperature Tcr. Finally, a voltage whose value is equal to a product of the current value Ia and a resistance value Rc of the resistor 2 is set as a reference voltage (Vref).

The voltage comparing circuit 4 includes two input terminals and one output terminal. One input terminal of the voltage comparing circuit 4 is connected to the cathode of the diode 1, whereas the other input terminal is connected to the constant voltage source 3. The output terminal of the voltage comparing circuit 4 is connected to the first output buffer circuit 5. The voltage comparing circuit 4 compares the voltage which the cathode of the diode 1 applies and the reference voltage which the constant voltage source 3 applies. The voltage comparing circuit 4 outputs, to the first output buffer circuit 5, an "ON/OFF" control signal for controlling an "ON/OFF" event of the first output buffer 5, in accordance with the compared result. The "ON/OFF" control signal is a signal for designating the "ON/OFF" event of the first output buffer circuit 5, thereby the first output buffer circuit 5 to be activated or inactivated.

The first output buffer circuit 5 is a three state buffer circuit which is set in an enable state or a disable state in accordance with the "ON/OFF" control signal. An output signal from the first output buffer circuit 5 being in the disable state is in a high impedance state. The first output buffer circuit 5 includes a control terminal, an input terminal and an output terminal. The "ON/OFF" control signal transmitted from the voltage comparing circuit 4 is input to the control terminal.

The second output buffer circuit 6 includes an input terminal and an output terminal.

The input terminal of the first output buffer circuit 5 and the input terminal of the second output buffer circuit 6 are both connected to the signal input terminal 7, and the output terminals thereof are connected to the signal output terminal 8.

The signal input terminal 7 is connected to an output port of the signal processing circuit 103 included in the bus utilization apparatus, such as the CPU, memory and the like. The signal output terminal 8 is connected to a corresponding one of the transmission paths forming the bus. Each of the first and second output circuits 5 and 6 receives a to-be-output signal via the signal input terminal 7, amplifies the received signal (usually, the amplification factor is one), and transmits the amplified signal to the bus via the signal output terminal 8. The end of the bus is connected to an end terminal resistor, so as to be set in an end terminal voltage (a particular voltage).

Figure 3A:
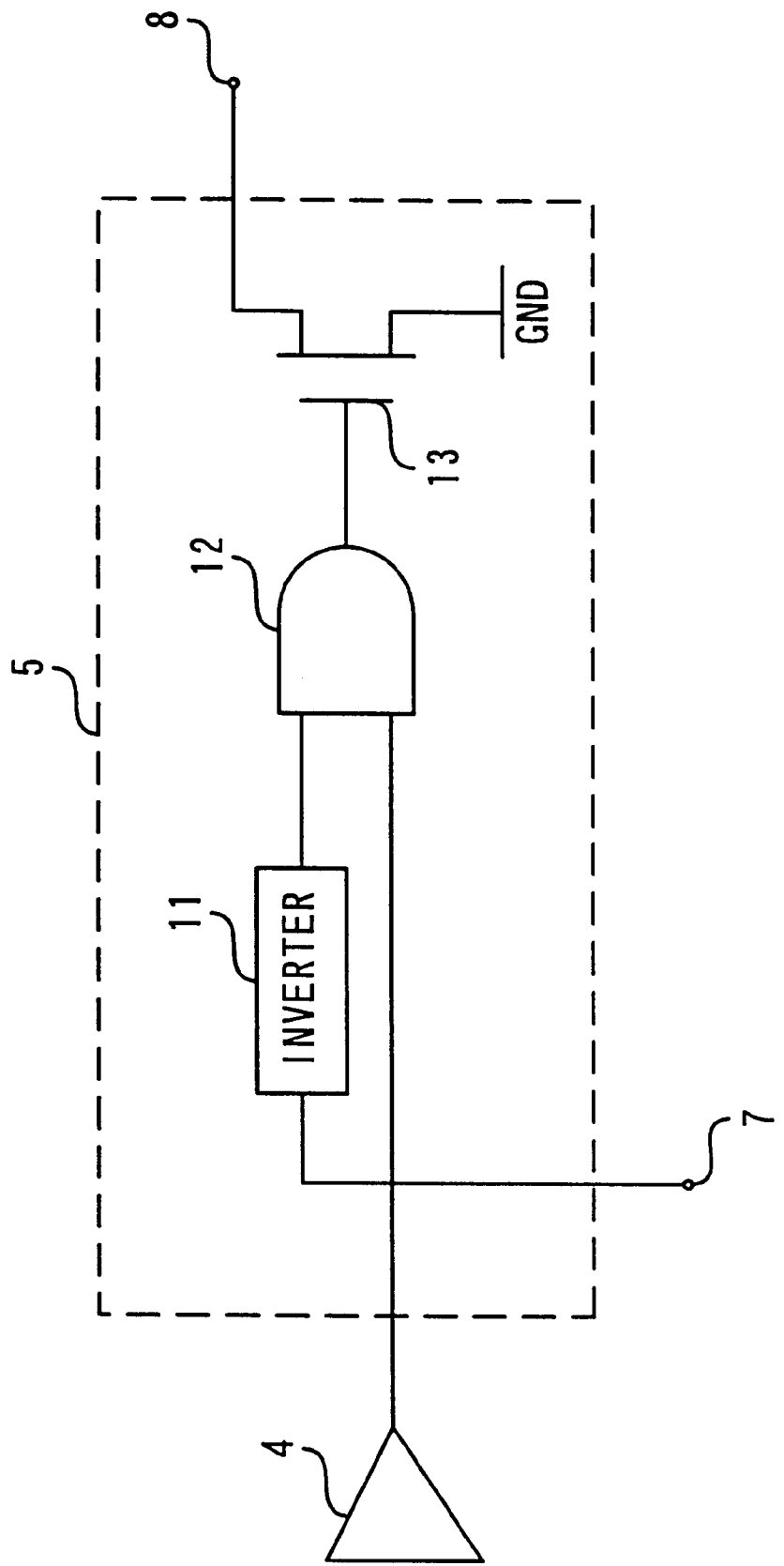
FIG. 3A is a diagram showing a structure of the first output buffer circuit.

Specifically, the first output circuit 5 includes, for example, an inverter circuit 11, a two-input "AND" circuit 12 and an NMOS transistor 13 which are shown in FIG. 3A. The inverter circuit 11 includes an input terminal which is connected to the signal input terminal 7. The two-input "AND" circuit 12 receives an output signal from the inverter circuit 11 and the ON/OFF control signal from the voltage comparing circuit 4. When the "ON/OFF" control signal is activated (logical value 1), the two-input "AND" circuit 12 outputs the output signal received from the inverter circuit 11, and when an "ON/OFF" control signal is inactivated (logical value 0), the circuit outputs a low level signal. The NMOS transistor 13 is of an open drain type, having a gate, a source and a drain. The gate of the NMOS transistor 13 receives an output signal from the two-input "AND" circuit 12, the source is grounded and the drain is connected to the signal output terminal 8.

Figure 3B:
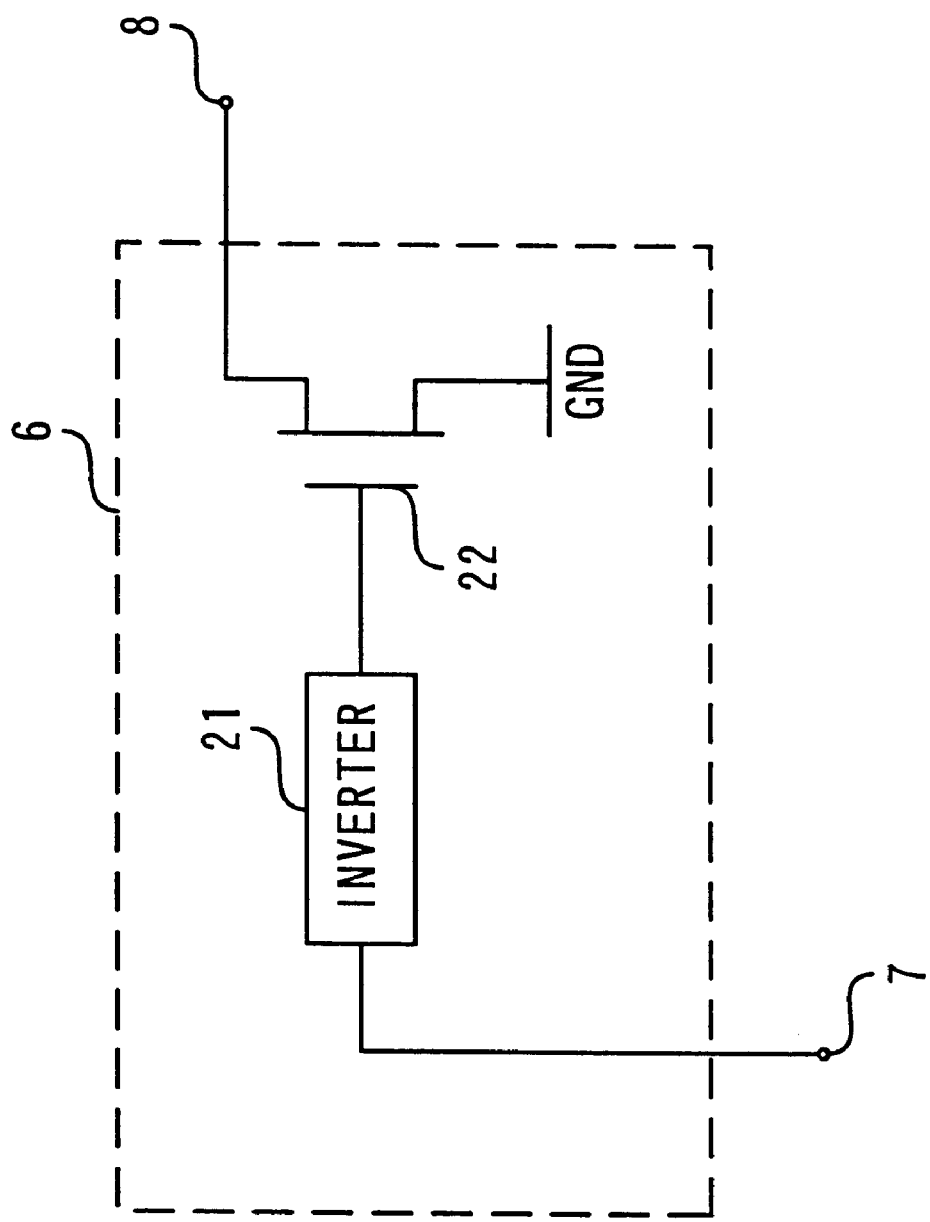
FIG. 3B is a diagram showing a structure of the second output buffer circuit.

For example, the second output buffer circuit 6 includes the inverter circuit 21 and an open drain type NMOS transistor 22, as shown in FIG. 3B. The inverter circuit 21 has an input terminal connected to the signal input terminal 7. The NMOS transistor 22 comprises a gate connected to an output terminal of the inverter circuit 21, a source which is grounded and a drain connected to the signal output terminal 8.

Operations of the bus driver circuit having the above-described structure will now be described.

As described above, the oscillating signal is generated as the combination of the signals output from the first output buffer circuit 5 and the second output buffer circuit 6, i.e., a ringing event occurs in the generated signal. Assume that the ringing event significantly occurs in the generated signal, as the temperatures of the first and second output buffer circuits 5 and 6 become equal to or above a temperature Tcr.

In a case where the temperatures of the first and second output buffer circuits 5 and 6 are sufficiently lower than the temperature Tcr, a value of the current Ia flowing into the diode 1 is relatively small, and a value of the voltage (Rc×Ia) of the cathode is smaller than a value of the reference voltage Vref (that is, Vref>Rc×Ia). The voltage comparing circuit 4 supplies an "ON" control signal (logical value "1") to the control terminal of the first output buffer circuit 5. Now, the first output buffer circuit 5 is in the enable state. On the contrary, the second output buffer circuit 6 is always in the enable state. Accordingly, both of the first and second output buffer circuits 5 and 6 drive the bus in accordance with the signal supplied from the input terminal 7.

As the bus driver circuit is driven for a long driving period, the temperature of the bus driver circuit rises, as a result of generation of heat in the circuit. As the temperature of the bus driver circuit rises, a larger amount of current gradually flows into the diode 1, in accordance with temperature-current properties of the diode 1. As the temperature of the bus driver circuit rises, the temperature of the first output buffer circuit 5 rises.

If the temperature of the bus driver circuit (which corresponds to the temperature of the first output buffer circuit 5) is equal to or above the temperature Tcr, the voltage (Rc×Ia) of the cathode included in the diode 1 is equal to or greater than the reference voltage Vref which the constant voltage circuit 3 applies (i.e., Vref≦Rc×Ia).

If Vref≦Rc×Ia, the voltage comparing circuit 4 inputs an "OFF" control signal (logical value "0") to the control terminal of the first output buffer circuit 5.

When the first output buffer circuit 5 receives the "OFF" control signal, it is in the disable state. As a result of this, only the second output buffer circuit 6 drives the bus. Therefore, the ringing event, occurring in the signal generated as the combination of the signals output from the two output buffer circuits 5 and 6 at different phases, does not occur.

When the first output buffer circuit 5 is inactivated, a smaller amount of current flows into the bus driver circuit, than the amount of current flowing when the temperature is low. A small amount of heat is generated in the bus driver circuit, thus, the temperature of the bus driver circuit becomes low.

Accordingly, if Vref≦Rc×Ia, as the result of the increase in the temperature, the bus driver circuit inactivates the first output buffer circuit 5. The ringing event is prevented from occurring in the signal output from the signal output terminal 8 to the bus, because only one output buffer circuit 6 is activated. Hence, any signal transmitted to the bus does not oscillates, that is, the signal is transmitted appropriately, so that any device connected to the bus can be processed properly.

The bus driver circuit may having any one of various structures, which differs from the above-described structure.

Figure 4A:
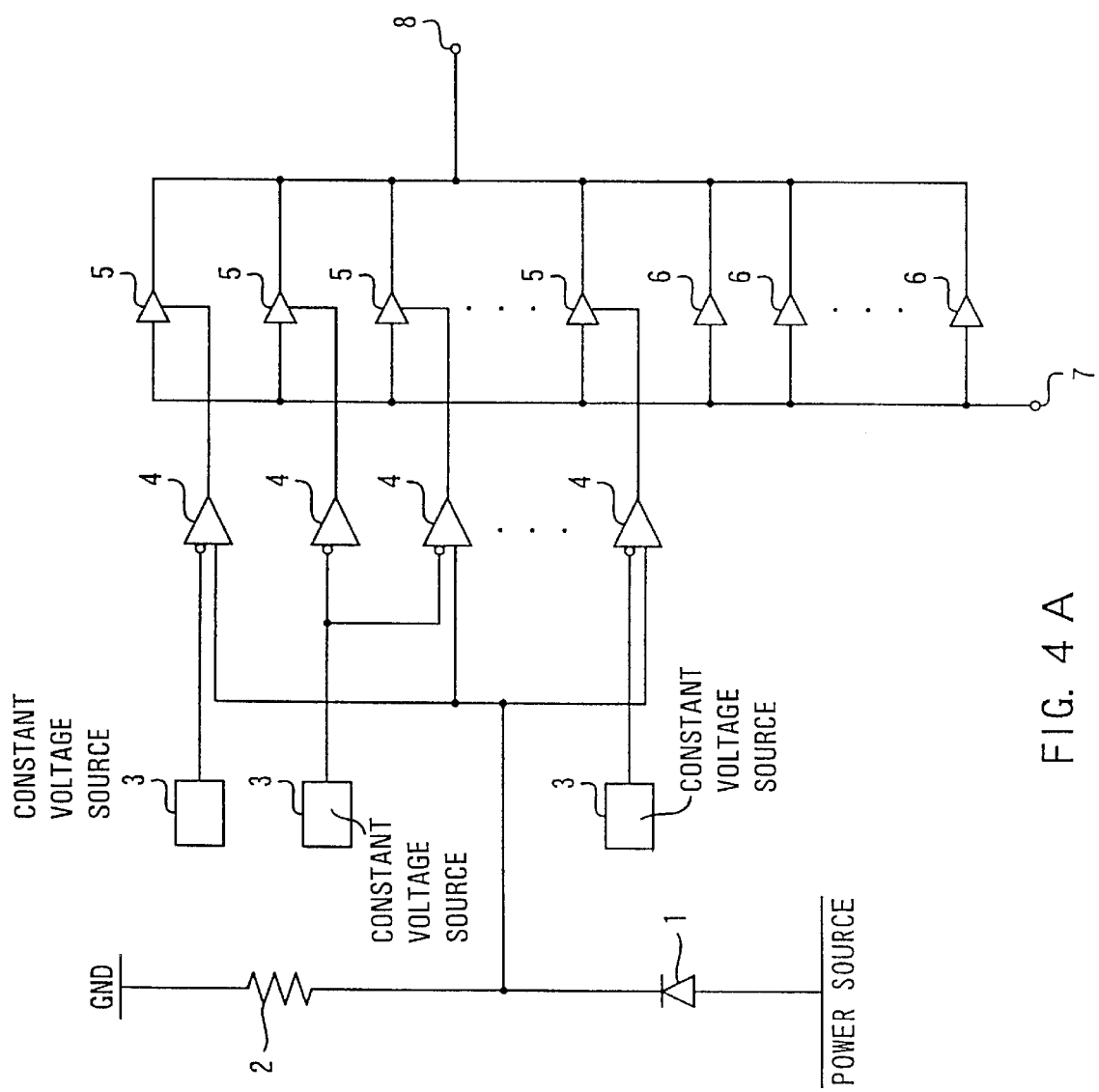
FIGS. 4A to 4C are diagrams each showing another structure of the bus driver circuit.

As illustrated in FIG. 4A, for example, a plurality of constant voltage sources 3, voltage comparing circuits 4, first output buffer circuits 5 and second output buffer circuits 6 may be arranged. The plurality of constant voltage sources 3 apply reference voltages whose values are different from one another. That is, the constant voltage sources 3 respectively apply voltages corresponding to particular temperatures, which are not the same, to a corresponding one of or more voltage comparing circuits 4. Different numbers of voltage comparing circuit(s) 4 may be connected to a single constant voltage source 3.

In such a structure, there may be a change in the number of first output buffer circuits 5 being in the disable state, in accordance with their temperature. For example, as the temperature rises, the number of first output buffer circuits 5 being in the disable state may increase. Specifically, the entire first output buffer circuits 5 are in the enable state at a temperature below the first temperature T1, and only one first output buffer circuit 5 is in the disable state in a range between a temperature equal to or above the first temperature T1 and below the second temperature T2 (T2>T1), further two first output buffer circuits 5 are in the disable state at a temperature equal to or above the second temperature T2.

Figure 4B:
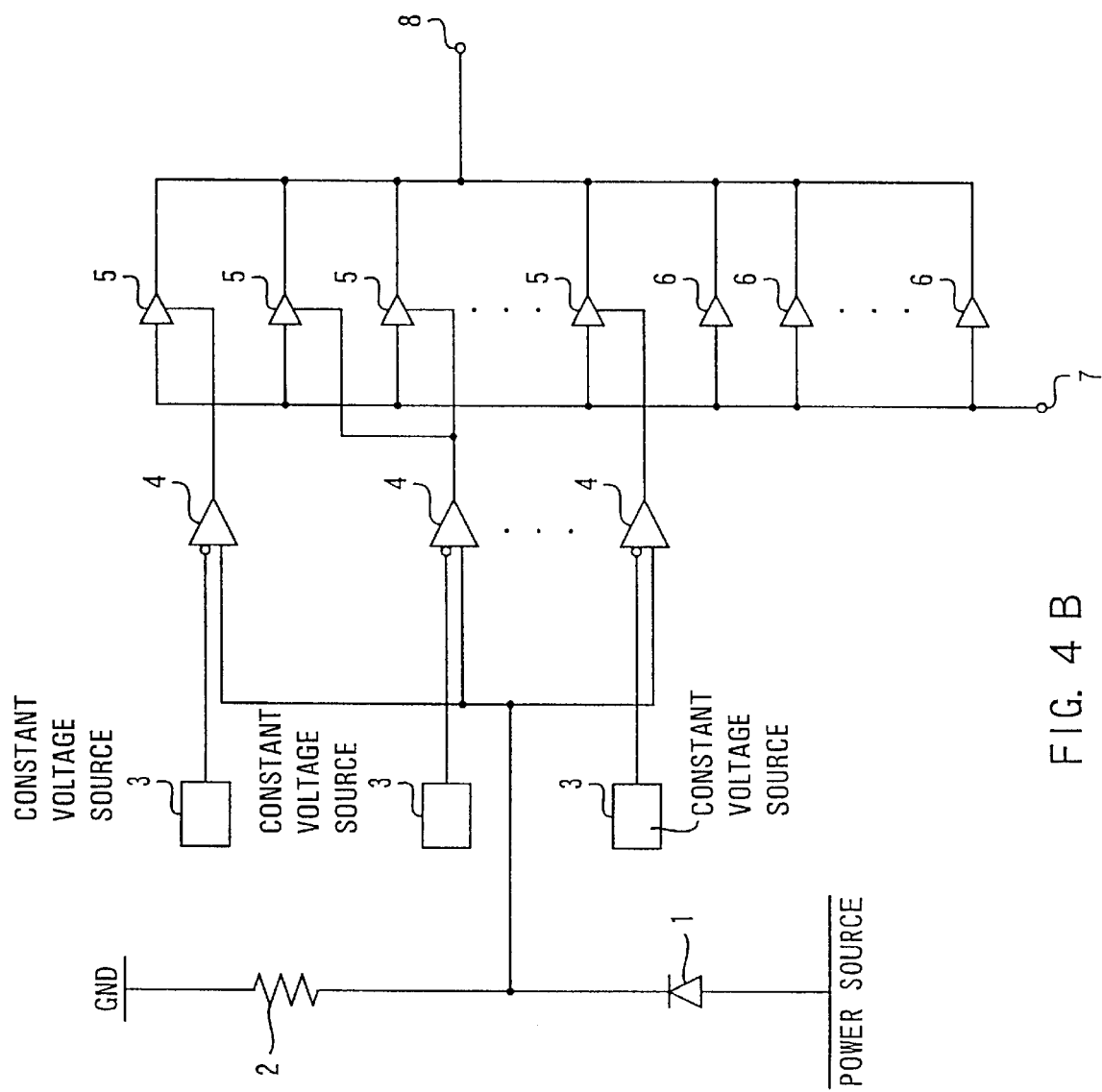

As shown in FIG. 4B, different numbers of first output buffer circuit(s) 5 may be connected to a single voltage comparing circuit 4, unlike the above-described case where different numbers of voltage comparing circuit(s) 4 may be connected to a single constant voltage source 3. In such a case, there may be a change in the number of first output buffer circuits 5 being in the disable state, in accordance with their temperature.

Figure 4C:
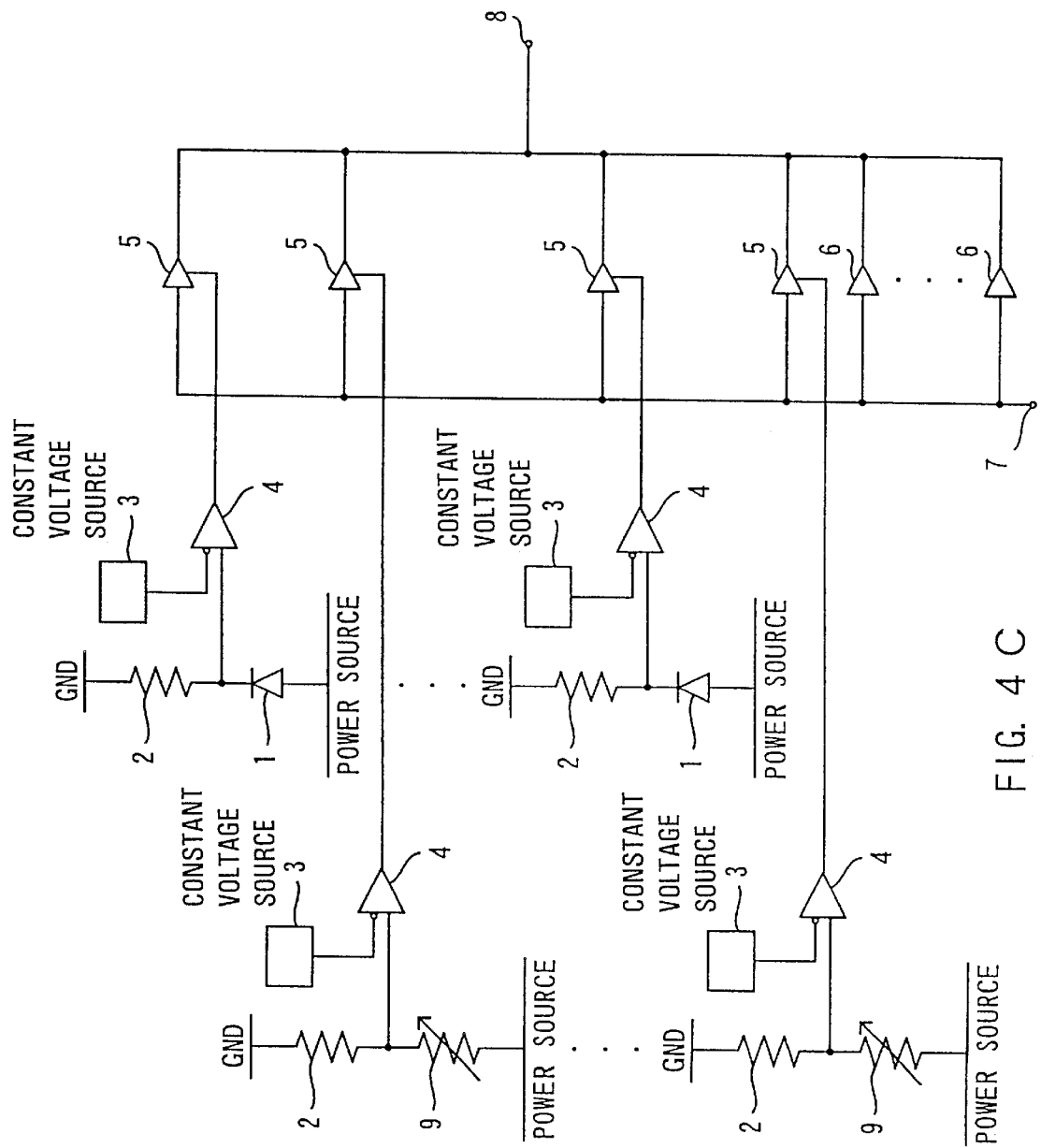

As shown in FIG. 4C, a plurality of bus driver circuits one of which is shown in FIG. 2 may be arranged, and a variable resistor 9 whose resistance value varies in accordance with the temperature may be employed in place of the diode 1. In this structure, there may be a change in the number of first output buffer circuits 5 being in the disable state, in accordance with their temperature. The diodes 1 and the variable resistors 9 may having different temperature-current properties.

Figure 5A:
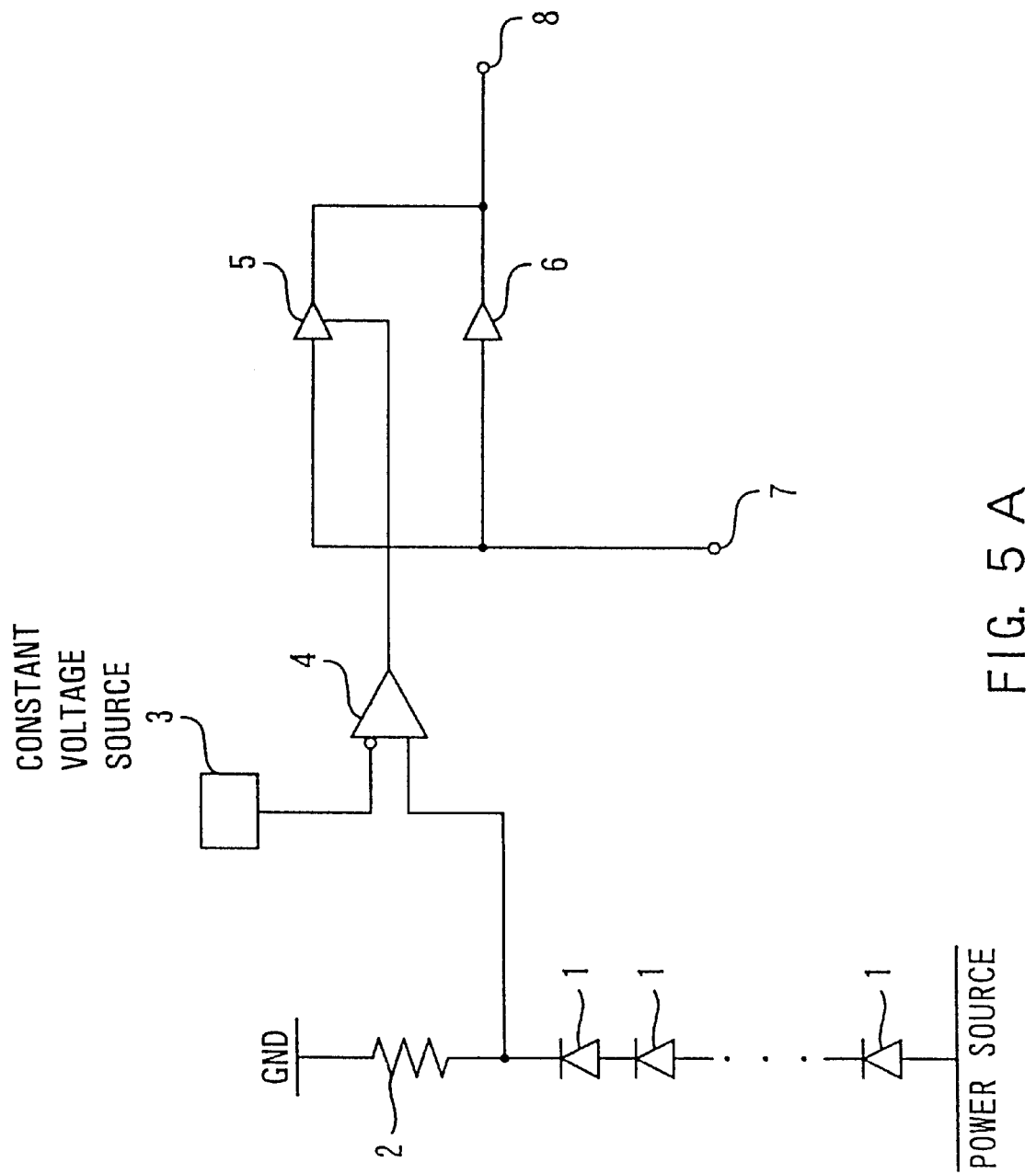
FIGS. 5A and 5B are diagrams each showing another structure of the bus driver circuit.

Furthermore, as illustrated in FIG. 5A, a plurality of diodes 1 may be connected with each other in series between the resistor 2 and the power source. In this case, the voltage comparing circuit 4 compares the reference voltage with a voltage of a connection point where the diodes 1 and the resistor 2 are connected.

Figure 5B:
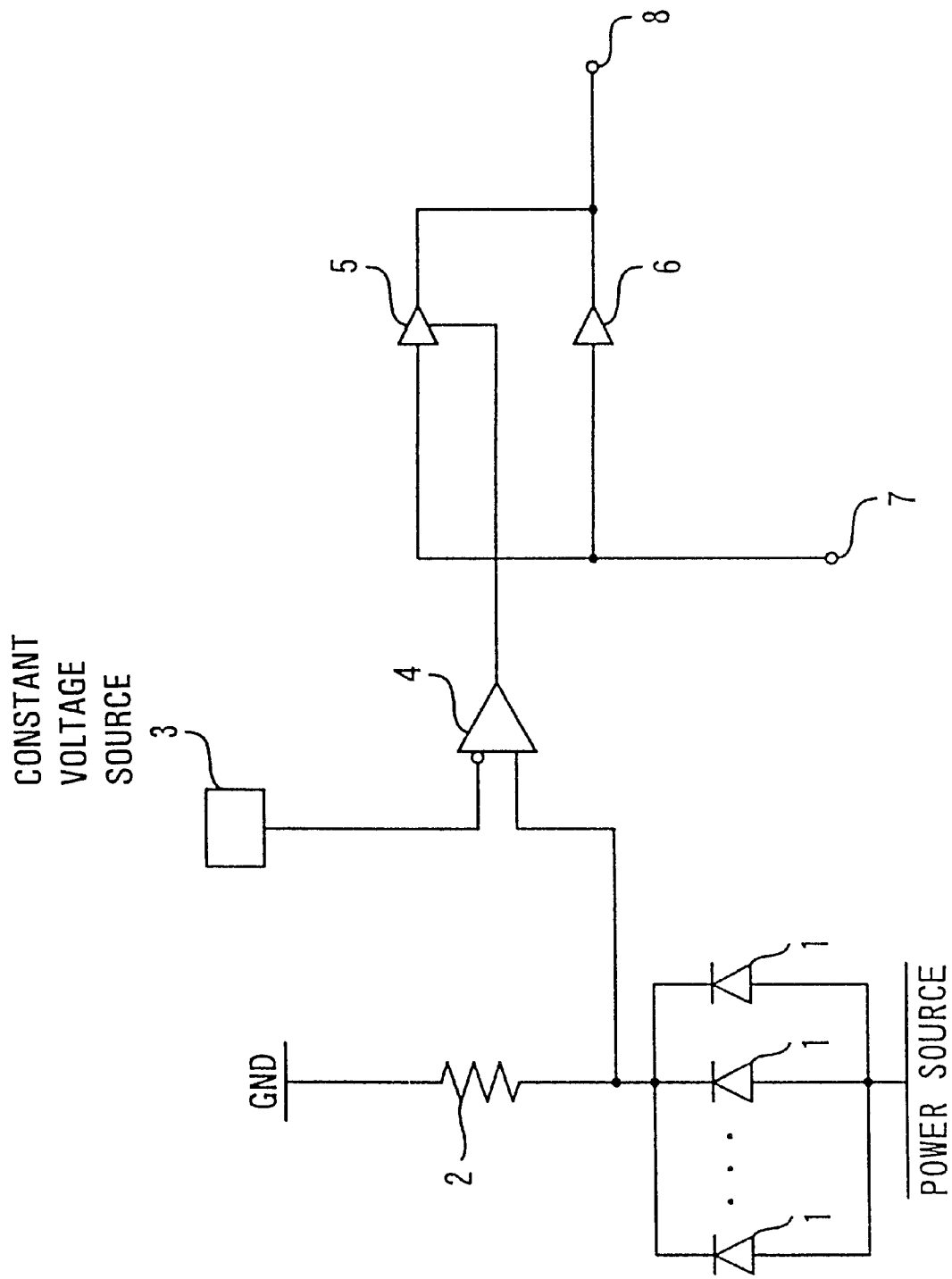
Figure 6:
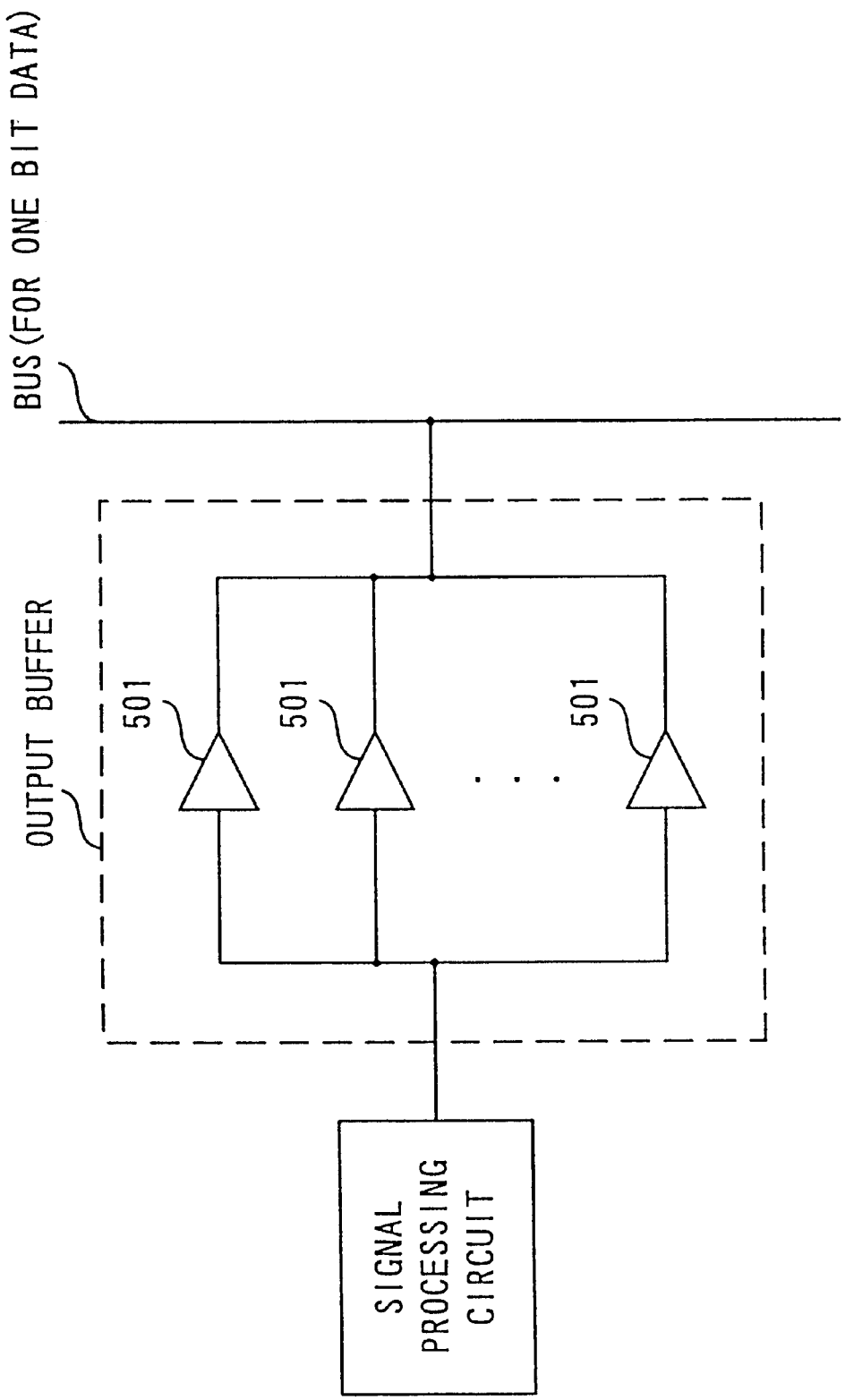
FIG. 6 is a diagram showing a structure of a conventional output buffer.

In addition to this, as shown in FIG. 5B, the plurality of diodes 1 may be connected with each other in parallel between the resistor 2 and the power source.

A variable voltage source for controlling the level of the voltage may be used in place of the constant voltage source 3 in the bus driver circuit. By employing the variable voltage source, the temperature at which the first output buffer circuit 5 is inactivated can be changed.

In addition to the above, more than three pieces of three state buffer circuits may be arranged. In the case where a plurality of three state buffer circuits are arranged, the plurality of three state buffer circuits are inactivated one at a time, every time the temperature of the first output buffer circuits 5 becomes equal to or above one of predetermined temperatures. Further, in place of the plurality of constant voltage sources 3 and voltage comparing circuits 4, a controller, having both functions of the constant voltage sources 3 and the voltage comparing circuits 4, may be arranged. The controller may output a signal for inactivating a predetermined number of first output buffer circuits 5 and may control the number of first output buffer circuits 5 being inactivated in accordance with their temperature.

In the above-described embodiment, a case where the output adjusting circuit is employed in the bus driver circuit has been explained, however, the output adjusting circuit may be employed in another unit or circuit except in the bus driver circuit. For example, the output adjusting circuit may be employed in any kind of circuit (apparatus), for example computer, etc., as long as the circuit is inappropriately operated as its temperature rises.

A circuit (for example, a switch) which is activated or inactivated in response to an output of the voltage comparing circuit 4 may be employed in place of the output buffer circuit 5. The voltage of the constant voltage source 3 is set at a particular voltage corresponding to a critical temperature at which the circuit (apparatus) is inappropriately activated. In a case where the temperature of the circuit (apparatus) is equal to or above a critical temperature, the temperature of the circuit (apparatus) becomes low if the entire or a part of operations of the circuit (apparatus) inactivated. That is, the circuit (apparatus) can always be operated appropriately.

Further, the positions of the diode 1 and the resistor 2 may be switched to the contrary.

The signal output terminal 8 may directly be connected to a circuit, etc., as the target device to be driven.

Various embodiments and changes may be made thereonto without departing from the broad spirit and scope of the invention. The above-described embodiment is intended to illustrate the present invention, not to limit the scope of the present invention. The scope of the present invention is shown by the attached claims rather than the embodiment. Various modifications made within the meaning of an equivalent of the claims of the invention and within the claims are to be regarded to be in the scope of the present invention.

This application is based on Japanese Patent Application No. H10-250266 filed on Sep. 4, 1998 and including specification, claims, drawings and summary. The disclosure of the above Japanese Patent Application is incorporated herein by reference in its entirety.

What is claimed is:

1. A bus driver comprising:
   a plurality of output buffer circuits which are connected to a common input terminal and a common output terminal and each of which outputs a signal, for driving a bus, having a signal level corresponding to a signal level of a signal supplied to the input terminal, to the output terminal;
   a temperature detecting circuit which detects a temperature of at least one of said plurality of output buffer circuits; and
   a controlling circuit which determines whether the detected temperature of the at least one of said plurality of output buffer circuits is equal to or above a first reference temperature, and which inactivates at least one of said plurality of output buffer circuits when determined that the detected temperature is equal to or above the first reference temperature.

2. The bus driver according to claim 1, wherein:
   said plurality of output buffer circuits include three or more circuits; and
   said controlling circuit
      compares the temperature detected by said temperature detecting circuit with the first reference temperature and also with a second reference temperature which is above the first reference temperature, inactivates a first predetermined number of output buffer circuits when the temperature detected by said temperature detecting circuit is equal to or above the first reference temperature but below the second reference temperature, and inactivates a second predetermined number of output buffer circuits in addition to the first predetermined number of output buffer circuits when the detected temperature is equal to or above the second reference temperature.

3. The bus driver according to claim 2, wherein:

said temperature detecting circuit includes a diode circuit and a resistor which are connected in series between a power source and a ground; and said controlling circuit compares a voltage of a connecting point, where the diode circuit and the resistor are connected, with a first reference voltage substantially equal to a voltage of the connecting point when said plurality of output buffer circuits are at the first reference temperature, and also with a second reference voltage substantially equal to the voltage of the connecting point when said plurality of output buffer circuits are at the second reference temperature, and outputs a signal for activating or inactivating said plurality of output buffer circuits in accordance with a compared result to said plurality of output buffer circuits.

4. The bus driver according to claim 3, wherein at least one of said plurality of output buffer circuits which is inactivated by said controlling circuit comprises a three state buffer circuit.

5. The bus driver according to claim 4, wherein said controlling circuit prevents ringing from occurring in a signal output from said plurality of output buffer circuits, by inactivating at least one of said plurality of output buffer circuits.

6. An output adjusting method comprising:

detecting a temperature of at least one of a plurality of output buffer circuit connected to a common input terminal and an output terminal;

comparing the detected temperature of said plurality of output buffer circuits and a first reference temperature;

inactivating at least one of the plurality of output buffer circuits when determined the temperature of the at least one of the plurality of output buffer circuits is equal to or above the first reference temperature;

controlling the entire output buffer circuits to output signals substantially at an identical phase parallels to the output terminal when the detected temperature is below the first reference temperature; and controlling at least one of the plurality of activated output buffer circuits to output a signal in which any ringing event does not substantially occur, to the output terminal, when the detected temperature is equal to or above the first reference temperature.

7. The output adjusting method according to claim 6, wherein:

the output buffer circuits include three or more circuits; and said inactivating includes inactivating a first number of output buffer circuits when determined that the detected temperature is equal to or above the first reference temperature, and inactivating a second number of output buffer circuits when determined that the detected temperature is equal to or above a second reference temperature above the first reference temperature.

8. The output adjusting method according to claim 7, wherein the second number is larger than the first number.

9. A driver comprising:

an "n" number of driver circuits which are connected to a common input terminal and a common output terminal, respectively output signals at an identical phase, and drive a target device to be driven in cooperation with each other;

a temperature detecting circuit which detects a temperature of at least one of said "n" number of driver circuits; and a controlling circuit which determines whether the temperature detected by said temperature detecting circuit is equal to or above a predetermined reference temperature, and sets all of said "n" number of driver circuits in an active state when determined that the detected temperature is below the reference temperature so as to control said "n" number of driver circuits to drive the target device, and inactivates an "m" ("m" is a natural number smaller than "n") number of driver circuits included in said "n" number of driver circuits when determined that the temperature detected by said temperature detecting circuit is above the reference temperature, and controls an "n–m" number of driver circuits to drive the target device, in a state where a ringing event, resulted from signals which are output by the driver circuits at different phases in accordance with the temperature of said driver circuits, is controlled.

* * * * *